United States Patent [19]

Welch et al.

[11] Patent Number: 4,980,738
[45] Date of Patent: Dec. 25, 1990

[54] SINGLE POLYSILICON LAYER TRANSISTOR WITH REDUCED EMITTER AND BASE RESISTANCE

[75] Inventors: Michael T. Welch, Sugarland, Tex.; David P. Favreau, Allentown, Pa.

[73] Assignee: Texas Instruments Incorporated, Dallas, Tex.

[21] Appl. No.: 213,213

[22] Filed: Jun. 29, 1988

[51] Int. Cl.⁵ .............................................. H01L 29/72
[52] U.S. Cl. ........................................ 357/34; 357/59
[58] Field of Search .................. 357/59 H, 59 I, 34, 357/67 S

[56] References Cited

U.S. PATENT DOCUMENTS

| 4,495,512 | 1/1985 | Isaac et al. | 357/59 H |
| 4,686,763 | 8/1987 | Thomas et al. | 357/59 H |
| 4,705,599 | 11/1987 | Suda et al. | 357/34 |
| 4,728,618 | 3/1988 | Hirao | 357/59 H |
| 4,847,670 | 7/1989 | Monkowski et al. | 357/34 |

FOREIGN PATENT DOCUMENTS 5934660  2/1984  Japan ........................... 357/59 H

OTHER PUBLICATIONS

IBM Technical Disclosure Bulletin, vol. 28, #1, pp. 26-27, Jun., 1985.

Primary Examiner—Andrew J. James
Assistant Examiner—Mark Prenty

[57] ABSTRACT

A single layer polysilicon self-aligned transistor (52) is provided having a substantially vertical emitter contact region (62), such that the emitter contact region (62) does not require extending portions overlying the base region (60). Heavily doped silicided regions (68) are disposed adjacent the emitter (64) in a self-aligned process such that the base resistance of the device is minimized. A planar oxide layer (72) is formed such that the emitter contact region (62) are exposed without exposing other polysilicon gates of the integrated circuit. A metal layer (76) may be disposed over the planar oxide layer (72) to form a level of interconnects.

2 Claims, 1 Drawing Sheet 4,980,738

SINGLE POLYSILICON LAYER TRANSISTOR WITH REDUCED EMITTER AND BASE RESISTANCE

TECHNICAL FIELD OF THE INVENTION

This invention pertains in general to integrated circuits, and more particular to a single polysilicon bipolar transistor having reduced base and emitter resistance.

BACKGROUND OF THE INVENTION

For advanced bipolar transistors, the effect of parasitic series resistance can significantly degrade AC switching performance, particularly in light of the increasingly higher current densities. Advanced transistor designs minimize the resistances by using self-aligned device structures and polysilicon emitter technology. The self-alignment of the emitter-base minimizes the base resistance, while the polysilicon emitter allows for high base doping without degrading the current gain.

It is often desirable to incorporate advanced bipolar and advanced CMOS technology on the same integrated circuit. A simple method of achieving a "Bi-CMOS" device is to use the polysilicon gate process to simultaneously fabricate the polysilicon emitter of the bipolar transistor.

For purposes of reducing the emitter resistance, it is desirable to place a contact directly over the polysilicon which overlies the emitter of the transistor. In cases of submicron emitters, however, the alignment tolerance becomes critical, and therefore, some means is necessary to ensure alignment between the polysilicon and the metal contacts.

Two previously developed bipolar transistors use a single poly structure in a Bi-CMOS device. In the first transistor structure, a polysilicon region having an enlarged upper portion is disposed directly above the base region. The enlarged polysilicon portion allows a contact to be made to the emitter, even if the dimension of the emitter are less than the contact. Unfortunately, the enlarged polysilicon portion increases the distance between the emitter and the extrinsic base region, thereby increasing the base resistance of the transistor. Furthermore, the enlarged polysilicon portion is separated from the intrinsic base by an oxide layer, thereby increasing the transistor emitter-base capacitance.

Another single-poly transistor structure uses a polysilicon emitter which overlaps a field oxide region adjacent to the base of the transistor. While this structure reduces the separation of the extrinsic base and the emitter, the size of the emitter is dependent upon the alignment of the polysilicon pattern.

Therefore, a need has arisen to provide a single polysilicon transistor having reduced emitter and base resistances, while ensuring reliable contact to the transistor.

SUMMARY OF THE INVENTION

In accordance with the present invention, and single layer polysilicon self-aligned transistor is provided which substantially eliminates or prevents disadvantages and problems associated with prior transistor structures.

The transistor of the present invention comprises a polysilicon emitter contact region having substantially vertical sidewalls overlying a base region. Dopants from the polysilicon emitter contact region are diffused into the base region to form a self-aligned emitter. A substantially planar dielectric layer surrounds the emitter contact region. In forming the planar oxide layer, a photoresist layer may be pre-etched such that only the polysilicon emitter contacts are exposed after the planarization etch, to the exclusion of other polysilicon conductors on the integrated circuit. Silicide regions formed on the base region are heavily doped to implement a low conductivity external base.

The present invention provides several technical advantages over prior art devices. Since no overlap is utilized in the polysilicon emitter contact, the external base regions may be located in close proximity to the emitter using a self-aligned process, thereby reducing the base resistance of the device Furthermore, the size of the emitter can be accurately controlled using conventional photolithographic techniques. Additionally, the process is compatible with other structures, such as CMOS, to enable integration of the transistor with other device structures. The planarization technique allows contacts to be made to submicron polysilicon lines, thereby reducing the emitter resistance of the device.

BRIEF DESCRIPTION OF THE DRAWINGS

For a more complete understanding of the present invention and the advantages thereof, reference is now made to the following descriptions, taken in conjunction with the accompanying drawings in which.

DETAILED DESCRIPTION OF THE INVENTION

The preferred embodiment of the present invention is illustrated in FIGS. 1-4 of the drawings, like numerals being used to refer to like and corresponding parts of the various drawings.

Figure 1A:
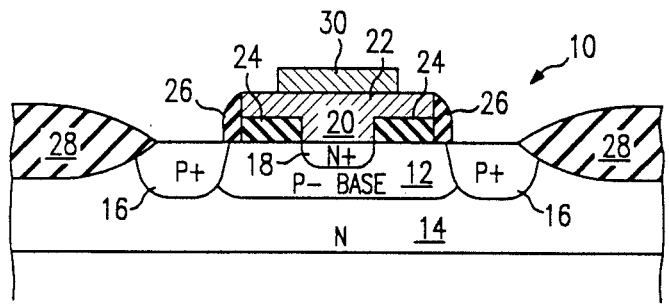
FIGS. 1a-b illustrate cross-sectional side views of prior art single-polysilicon transistors.
Figure 1B:
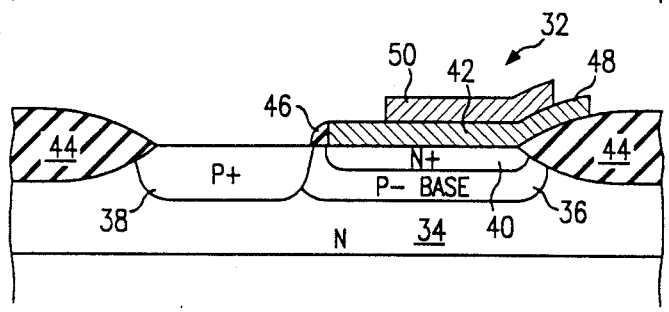

FIGS. 1a-b illustrate cross-sectional side views of prior art single-polysilicon transistors. A "single-polysilicon" or "single-poly" transistor is so named to indicate that a polysilicon layer is used for diffusion of the emitter into the base region. Consequently, the polysilicon contact to the emitter is self-aligned.

In the previously developed transistor 10 of FIG. 1a, a P− base region 12 is disposed in an N-epitaxial layer 14 operable as a collector. The P− base region 12 is flanked by P+ external base regions 16 which act as low resistance paths to the interconnect circuitry. An N+ emitter 18 is formed within the base region 12. A polysilicon emitter contact 20 overlies the emitter 18. The emitter contact 20 includes extended portions 22 which overlie the base region 12 and are separated therefrom by oxide regions 24. Sidewall oxide regions 26 are disposed adjacent the emitter 18 to prevent silicide shorting between the emitter 18 and P+base 16 when a self-aligned silicide process is used to reduce the resistivity of the P+ base 16. Field oxide regions 28 isolate the transistor 10 from other devices on the integrated circuit. A metal contact 30 provides an electrical connection to the emitter 18 via the emitter contact 20.

In a self-aligned transistor, the emitter 18 is formed by diffusing dopants from the polysilicon emitter contact 20 into the base region 12. Because some lateral diffusion in the base 12 will occur, the portion of the emitter contact 20 adjacent the semiconductor material will be entirely within the emitter 18. Similarly, the external base regions 16 are formed after formation of the sidewall oxide layers 26, thereby ensuring that the external base region 16 will not contact the emitter 18.

The purpose of the extended portions 22 of the polysilicon emitter contact 20 is to provide a pad on which the metal contact 30 may be safely aligned, even though the emitter 18 is of submicron portions. Unfortunately, the transistor 10 has several disadvantages as well. Since the external base regions 16 must be aligned to the outside edges of the extended portions 22 by the sidewall oxide regions 26, the distance between the emitter 18 and the external base region 16 is increased by the length of the extended portions 22. Since the P− base region 12 is of a much higher resistivity than the P+ external base region 16, the increased distance between the emitter 18 and the external base region 16 increases the base resistance of the transistor 10. Furthermore, the extended portions 22 form a capacitor with the base region 12, thereby increasing the emitter-base capacitance of the transistor 10.

In FIG. 1b, a second prior art transistor 32 is illustrated. The transistor 32 comprises an N type epitaxial layer 34 acting as a collector, with a P− base region 36 and a P+ external base region 38 formed therein. The emitter 40 is self-aligned to the emitter contact 42 which overlies the P− base region 36 and a field oxide region 44. The P+ external base region 38 is self-aligned to the emitter 40 by the sidewall oxide layer 46. The emitter contact 42 includes an extended portion 48 which overlies the field oxide 44.

Once again, the emitter 40 is diffused from the polysilicon emitter contact 42 into the P− base region 36. The emitter contact 42 provides a large pad for alignment of the metal contact 50. However, the alignment of the emitter contact 42 itself becomes critical, since the portion of the emitter contact 42 overlying the P− base 36 will determine the size of the emitter 40. Since the size of the emitter 40 will vary the characteristics of the transistor 32, this structure is unsatisfactory in many cases, especially for submicron emitter sizes where alignment tolerances are a larger fraction of the total emitter size.

Figure 2:
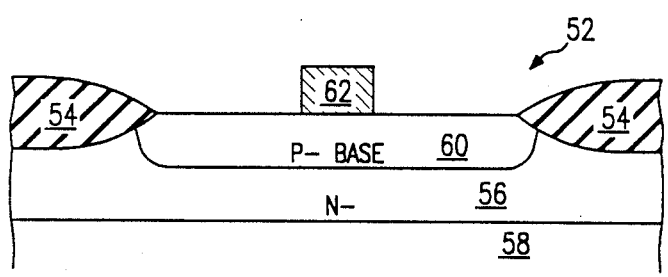
FIG. 2 illustrates a cross-sectional side view of the transistor of the present invention after a first processing stage.
Figure 3:
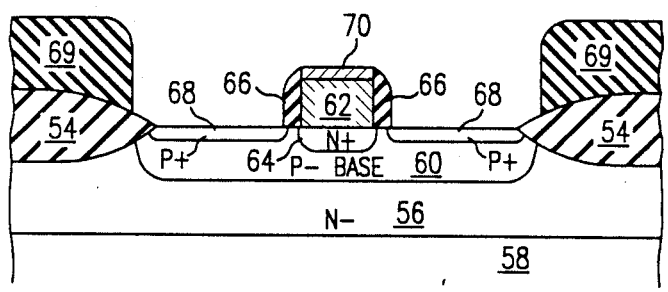
FIG. 3 illustrates a cross-sectional side view of the transistor of the present invention after a second processing stage.
Figure 4:
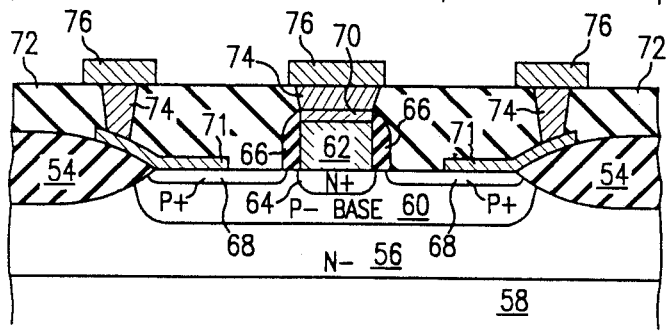
FIG. 4 illustrates a cross-sectional side view of the transistor of the present invention after a third processing stage.

FIGS. 2-4 illustrate cross-sectional side views of the present invention. FIG. 2 illustrates a cross-sectional side view of the transistor 52 of the present invention after a first processing stage. Field oxide regions 54 are grown on an N-epitaxial layer 56, typically formed on a semiconductor substrate 58. The N-epitaxial layer 56 is operable as a collector for the transistor 52. The N-epitaxial layer 56 is implanted with a P type dopant to form a P− base region 60 between the field oxide regions 54. A layer of polysilicon is disposed over the surface of the wafer and doped with an N type dopant. The polysilicon is etched to form an emitter contact 62. During subsequent high temperature processing steps, the N type dopants will diffuse from the emitter contact 62 to form an emitter 64 in the base region 60.

In FIG. 3, sidewall oxide regions 66 are formed on the emitter contact 62. The sidewall oxide regions 66 may be formed by depositing a film of oxide, typically TEOS (tetraethyl orthosilicate), of a few thousand angstroms over the surface of the wafer. An anisotropic etch is performed leaving the filaments around the emitter contact 62. The sidewall regions should be at least 500 angstroms in width to eliminate silicide shorting and to minimize any leakage through the oxide itself. The exposed portions of the P− base 60 and polysilicon emitter 62 are alloyed with a metal, such as titanium to form silicide regions 68 on the base 60 and a silicide region 70 on the emitter contact 62. The titanium will only react with the silicon and polysilicon, forming $TiSi_2$, and remains unreacted over the oxide regions, forming TiN. The TiN may be selectively removed, as described hereinbelow. In order to prevent excessive diffusion of the emitter 62, the titanium may be alloyed with the silicon at a relatively low temperature of about 675° C., or by using a rapid thermal anneal. Some silicon will be consumed during the anneal.

In a next processing step, a photoresist mask 69 is formed and the silicided regions 68 and 70 are implanted with a P type dopant, such that subsequent diffusion of the silicide portions 68 forms shallow P+ external base regions.

In FIG. 4, the transistor 62 of the present invention is shown after a third processing stage. During silicidation of the base 60, a layer of unreacted metal 71 will remain. This unreacted metal 71 may be patterned to form leads for external contacts.

A thick oxide layer 72 is formed over the surface of the transistor 52 and is planarized by forming a photoresist layer (not shown) thereover, and etching with a nonselective etch. If the transistor 52 is to be used in a bipolar-CMOS process, it is desirable that only the silicide regions 70 and leads 71, be exposed during the planarization etch. Thus, the gates of the CMOS transistors (also formed during the deposition of the polysilicon used to form the emitter contact 62) will be insulated during formation of the metal layer which will interconnect the transistors 52.

To planarize the oxide layer 72 such that only the silicide regions 70 and leads 71 will be exposed, an initial pattern is performed on the photoresist layer. Areas of photoresist overlying the silicide regions 70 and leads 71 are removed prior to the planarization etch. Thereafter, the planarization etch is performed, such that only the silicide regions 70 and leads 71 are exposed.

During the planarization etch, contacts 74 are formed through the oxide layer 72. The slope of the contacts 74 can be adjusted by varying the temperature of hard bake performed prior to the planarization etch. The contacts 74 are filled with a metal, such as tungsten, typically through chemical vapor deposition. The contacts are planarized, and the metal interconnect pattern is formed over the planar oxide layer 72 providing metal contacts 76 to the emitter and base regions.

The transistor of the present invention provides many technical advantages over the prior art. Because the sidewall oxide regions 66 serve to self-align the P+ external bases 68 with the emitter 64, the distance between the emitter 64 and the external base 68 may be as low as 2000 angstroms or less, depending upon the lateral diffusion of the emitter 64 and external base 68. The technique of diffusing the dopant from the silicided regions minimizes the lateral diffusion and allows the sidewall oxide to be as thin as possible. Therefore, the base resistance associated with the prior art transistor 10 is alleviated. Furthermore, since there are no overlapping polysilicon portions, the emitter contact 62 does not add to the base emitter capacitance of the transistor. Additionally, the size of the emitter is not dependent upon alignment, and the therefore the size of the structure can be precisely determined. The planarization technique allows contacts to be made to submicron polysilicon lines, thereby reducing the emitter resistance of the device.

The transistor 52 of the present invention has been described in connection with a NPN transistor; however, the processing could be used to form PNP transistors simply by switching the types of dopants used in the various regions.

Although the present invention has been described in detail, it should be understood that various changes, substitutions and alterations can be made herein without departing from the spirit and scope of the invention as defined by the appended claims.

What is claimed is:

1. A transistor, comprising:
   a semiconductor surface of a first conductivity type;
   dielectric regions overlying said semiconductor surface, the dielectric regions defining a base region in the semiconductor surface;
   a base region of a second conductivity type formed between the dielectric regions;
   an emitter contact region comprising a polysilicon region overlying a portion of said base region, the emitter contact region having substantially vertical sidewalls extending upward from the surface of the base region;
   dielectric sidewalls on the emitter contact region;
   an emitter region of the first conductivity type formed in the base region, the emitter region being formed in alignment with the sidewalls of the emitter contact region;
   silicided regions formed on the exposed portions of the base region and the emitter contact region, the silicided regions on the base region being formed in alignment with the dielectric sidewalls; and
   a dielectric layer overlying the base region substantially planar with the emitter contact region.

2. The transistor of claim 1, further comprising:
   a metal contact formed over a portion of the silicided regions formed on the base region, the metal contact being disposed beneath the dielectric layer.

* * * * *